US006889307B1

(12) United States Patent
Scheuerlein

(10) Patent No.: US 6,889,307 B1
(45) Date of Patent: May 3, 2005

(54) INTEGRATED CIRCUIT INCORPORATING DUAL ORGANIZATION MEMORY ARRAY

(75) Inventor: Roy E. Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 336 days.

(21) Appl. No.: 09/990,901

(22) Filed: Nov. 16, 2001

(51) Int. Cl.$^7$ .............................................. G06F 12/10
(52) U.S. Cl. ..................... 711/202; 711/212; 711/220
(58) Field of Search ............................... 711/202, 212, 711/220

(56) References Cited

U.S. PATENT DOCUMENTS

| | | | |
|---|---|---|---|
| 4,646,266 A | 2/1987 | Ovshinsky et al. ......... 365/105 |
| 5,109,360 A | 4/1992 | Inazumi et al. ............. 365/200 |
| 5,138,705 A * | 8/1992 | Lo et al. ......................... 711/2 |
| 5,172,341 A | 12/1992 | Amin .......................... 365/222 |
| 5,297,148 A | 3/1994 | Harari et al. |
| 5,315,558 A | 5/1994 | Hag ....................... 365/230.01 |
| 5,367,653 A | 11/1994 | Coyle et al. ................ 395/400 |
| 5,671,229 A | 9/1997 | Harari et al. .............. 371/10.2 |
| 5,691,945 A | 11/1997 | Liou et al. .................. 365/200 |
| 5,751,012 A | 5/1998 | Wolstenholme et al. ....... 257/5 |
| 5,764,576 A | 6/1998 | Hidaka et al. .............. 365/200 |
| 5,805,520 A | 9/1998 | Anglada et al. ........ 365/230.02 |
| 5,835,396 A | 11/1998 | Zhang .......................... 365/51 |
| 5,860,076 A * | 1/1999 | Greene et al. .................. 711/1 |
| 5,896,404 A | 4/1999 | Kellogg et al. .......... 371/40.11 |
| 5,999,446 A | 12/1999 | Harari et al. ........... 365/185.03 |
| 6,020,758 A | 2/2000 | Patel et al. ..................... 326/40 |
| 6,034,882 A | 3/2000 | Johnson et al. ............. 365/103 |
| 6,041,016 A * | 3/2000 | Freker ...................... 365/238.5 |
| 6,052,798 A | 4/2000 | Jeddeloh ........................ 714/8 |
| 6,055,180 A | 4/2000 | Gudesen et al. ............. 365/175 |
| 6,069,638 A | 5/2000 | Porterfield ................... 345/516 |
| 6,070,262 A | 5/2000 | Kellogg et al. .............. 714/763 |
| 6,081,463 A | 6/2000 | Shaffer et al. ............... 365/200 |
| 6,112,285 A * | 8/2000 | Ganapathy et al. .......... 711/207 |
| 6,149,316 A | 11/2000 | Harari et al. ........... 395/182.06 |
| 6,163,490 A | 12/2000 | Shaffer et al. ............... 365/200 |
| 6,166,559 A | 12/2000 | McClintock et al. .......... 326/10 |
| 6,192,487 B1 | 2/2001 | Douceur ......................... 714/8 |
| 6,236,602 B1 | 5/2001 | Patti ........................... 365/201 |
| 6,567,289 B1 * | 5/2003 | Cleveland et al. ............ 365/63 |
| 6,694,422 B1 * | 2/2004 | Kim ........................... 711/217 |

OTHER PUBLICATIONS

U.S. Appl. No. 09/748,649, filed Dec. 22, 2000, "Partial Selection of Passive Element Memory Cell Sub–Arrays for Write Operations," inventors Roy E. Scheuerlein and Matthew P. Crawley, 38 pp.
U.S. Appl. No. 09/897,705, filed Jun. 29, 2001, "Three–Dimensional Memory Array Incorporating Serial Chain Diode Stack," inventors Bendik Kleveland et al., 72 pp.

(Continued)

*Primary Examiner*—Hiep T. Nguyen
(74) *Attorney, Agent, or Firm*—Zagorin, O'Brien & Graham, LLP

(57) ABSTRACT

A memory organization supports a basic page size and an extended page size. A certain portion of its memory cells are dual-addressable memory cells which may be used to provide the additional memory required for the extended pages or alternatively may be used to provide additional memory within a basic page. A memory array is preferably implemented as basic pages and directly addressed to support the basic page size. The received addresses are translated to map each extended page into a portion of a basic page to support the extended pages. In one embodiment, high order row addresses are conveyed for use as high-order column addresses, and the high-order row addresses overridden, to map each extended page into a contiguous block of basic pages.

74 Claims, 7 Drawing Sheets

OTHER PUBLICATIONS

U.S. Appl. No. 09/747,574, filed Dec. 22, 2000, entitled "Three–Dimensional Memory Array and Method for Storing Data Bits and ECC Bits Therein," and naming inventors Thomas H. Lee, James M. Cleeves and Mark G. Johnson, 18 pages.

U.S. Appl. No. 09/560,626, filed Apr. 28, 2000, entitled "Three–Dimensional Memory Array and Method of Fabrication," naming inventor N. Johan Knall, 48 pp.

U.S. Appl. No. 09/638,428, filed Aug. 14, 2000, "Low Cost Three–Dimensional Memory Array," inventors Mark G. Johnson et al., 25 pp.

U.S. Appl. No. 09/814,727, filed Mar. 21, 2001, "Three Dimensional Memory Array and Method of Fabrication," inventors Johan Knall and Mark G. Johnson, 49 pp.

Toshio Wada et al, "A 15–ns 1024–Bit Fully Static MOS RAM," IEEE Journal of Solid–State Circuits, vol. SC–13, No. 5, Oct. 1978, pp. 635–639.

Kim C. Hardee and Rahul Sud, "A Fault–Tolerant 30 ns/375 mW 16K x 1 NMOS Static RAM,"IEEE Journal of Solid–State Circuits, vol. SC–16, No. 5, Oct. 1981, pp. 435–443.

Misao Higuchi et al., "An 85ns 16mB MOS EPROM with Alterable Word Organization," ISSCC 90, 1990 IEEE International Solid–State Circuits Conference, Feb. 1990, pp. 56–57.

"TH58512FT Toshiba MOS Digital Integrated Circuit Silicon Gate CMOS" datasheet, 1999, 34 pp.

* cited by examiner

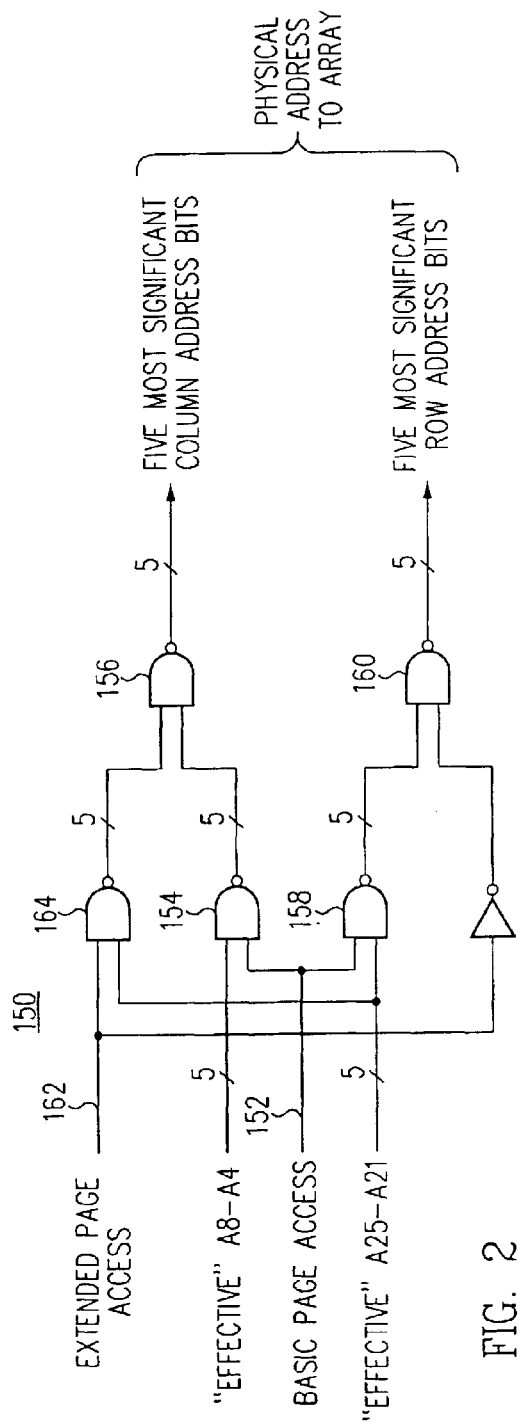
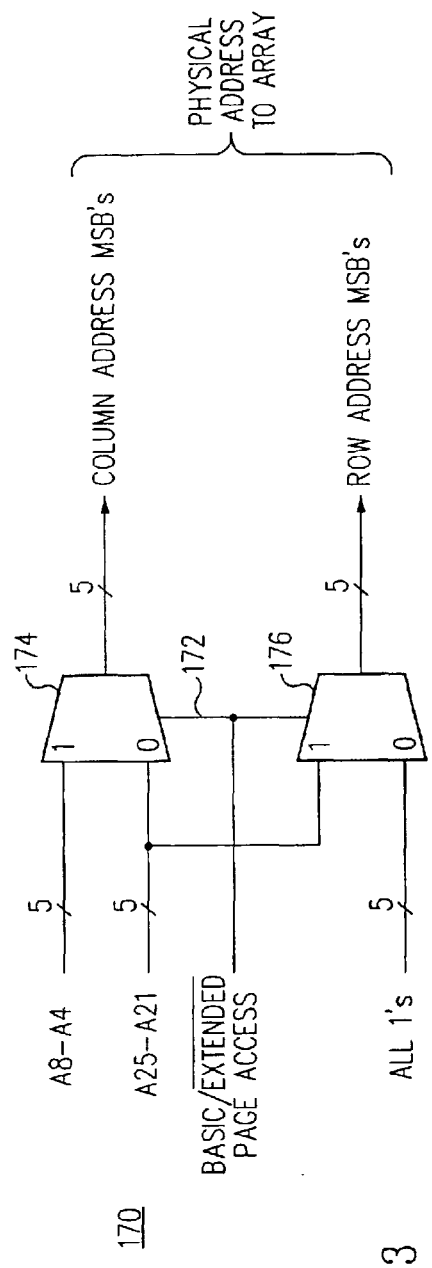
FIG. 2
FIG. 3

INTEGRATED CIRCUIT INCORPORATING DUAL ORGANIZATION MEMORY ARRAY

BACKGROUND

1. Field of the Invention

The present invention relates to memory array organization, and particularly to those memory arrays organized as a plurality of pages.

2. Description of the Related Art

Integrated circuit memory arrays are encountered in both specialized memory devices and in other more general integrated circuits. An address presented to the memory device (or memory sub-system within a more general integrated circuit) is usually decoded to select one or more memory cells corresponding to each given address. For example, many memory devices have byte-wide data paths, and each unique address usually selects eight different memory cells, which may be located adjacent to each other in one array, physically distributed within one array, or physically distributed in up to eight different sub-arrays. Some devices store more than one bit of information into a single memory cell, and thus obviously require less than eight memory cells to store a byte of information.

Irrespective of the internal architecture of a memory array (i.e., whether implemented as a single array or as many sub-arrays, whether an addressable byte is stored in contiguous memory cells within one array or distributed throughout more than one sub-array), many memory arrays may be conceptualized as being organized as a plurality of rows and a plurality of columns with one or more memory bits stored at each addressable row and column intersection.

Many memories may also be conceptualized as having a plurality of pages, each containing a plurality of locations within the page An address for such a memory specifies a page (which may also be viewed as a 'row' address) and an offset or location within the page (which may also be viewed as a 'column' address). Most memories are organized with a number of rows equal to an integral power of two, such as $2^{17}$ (i.e., 131,072 pages) and a number of columns also equal to an integral power of two, such as $2^9$ bytes (i.e., 512 bytes). An integral power of two may also be termed an 'even binary number.' Examples includes 16 (i.e., $2^4$) and 128 (i.e., $2^7$) but not 24 (i.e., $2^4+2^3$).

For example, some commercial 'Flash' EPROM devices, such as the 64 MB Toshiba TH58512FT, are organized as a plurality of 528-byte pages, which are accessed byte-serially by page. Of this page, 512 bytes are normally used for general storage, while the additional 16 bytes are provided for other specialized use, such as redundancy. Such a page size may be thought of as a basic page of 512 bytes, and an extended page adding another 16 bytes, for a total of 528 bytes per page. This extended page space adds about 3% more memory cells to the array. Unfortunately, many users do not utilize such an extended page space, frequently because the resulting page size of 528 bytes is not a power of two (and thus not a traditional binary 'boundary') consequently wasting the additional 3% area required to implement the extended page memory cells. Yet for compatibility reasons, many devices still implement such additional memory cells.

In addition, many Flash devices reserve a portion of its pages for use in replacing pages that, when tested or later programmed, are discovered to be defective. For example, in many 64 MB devices, up to 2–3% of all memory pages are reserved for redundancy, and the total amount of memory guaranteed to be fully functional after programing accordingly reduced. In a memory device with fewer defective pages than the reserved number set aside for such purposes, the remaining reserved pages may easily be wasted as well because they are not guaranteed to be available. Consequently, upwards of another 2–3% of memory cells physically implemented in the memory device may be wasted.

SUMMARY

A dual memory array organization transparently supports both basic page size use and extended page size use without wasting any memory cells when the extended pages are not utilized. A certain portion of its memory cells are dual-addressable memory cells which maybe used to provide the additional memory required for the extended pages, or alternatively may be used to provide additional basic page memory. In one embodiment, a memory array may be organized as basic pages and directly addressed to support the basic page size. But to support the extended pages, the addresses may be translated to map each extended page into a portion of an associated basic page. In certain embodiments, a number of the high order row addresses are conveyed for use instead as high-order column addresses, and the high-order row addresses overridden, to map the extended pages into a contiguous block of basic pages.

In another embodiment, an integrated circuit includes a memory array organized in pages of a first width. The memory array is addressable as pages of the first width and addressable as pages of a second width that is an additional width greater than the first width. When addressable as pages of the second width, the additional width of each page of the second width is mapped into at least one associated page of the first width. In certain embodiments each respective page, when addressed as pages of the second width, is addressable as a respective basic page of the first width and as a respective extended page of a width smaller than the first width, and the memory array may be configured to map each extended page into a corresponding portion of a corresponding basic page. The memory array may comprise a non-volatile memory array, whose memory cells may comprise passive element memory cells.

In another embodiment, an integrated circuit includes a memory array organized as a plurality of pages having a page width. An address translation block is included for translating an address of an effective location within a page that falls beyond the page width, into a corresponding address of a corresponding location of a corresponding page that falls within the page width, thereby mapping an effective page location beyond its page width into an associated page. The address translation block may be arranged to map at least one address bit that specifies a page into an address bit specifying a location within an associated page, and may also be arranged to map effective locations within the pages beyond the page width into a contiguous group of pages located at one end of the memory array. The page width may be equal to a first integral power of two, and the number of mapped locations of each page may be equal to a second integral power of two. In certain embodiments the memory array may comprise a plurality of sub-arrays, and memory cells comprising each page location may be distributed among at least two subarrays or may be disposed in a single sub-array.

Many other embodiments are contemplated, and a number of preferred embodiments are described in detail herebelow. Each may be used alone or in combination with one another.

BRIEF DESCRIPTION OF THE DRAWINGS

The accompanying drawings illustrate one or more embodiments of the present invention and, together with the detailed description, serve to better explain the present invention to those skilled in the art.

FIG. 2 is a schematic diagram of an address circuit useful for an embodiment of the present invention.

FIG. 3 is a schematic diagram of another address circuit useful for an embodiment of the present invention.

The use of the same reference symbols in different drawings indicates similar or identical items.

DESCRIPTION OF THE PREFERRED EMBODIMENT(S)

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
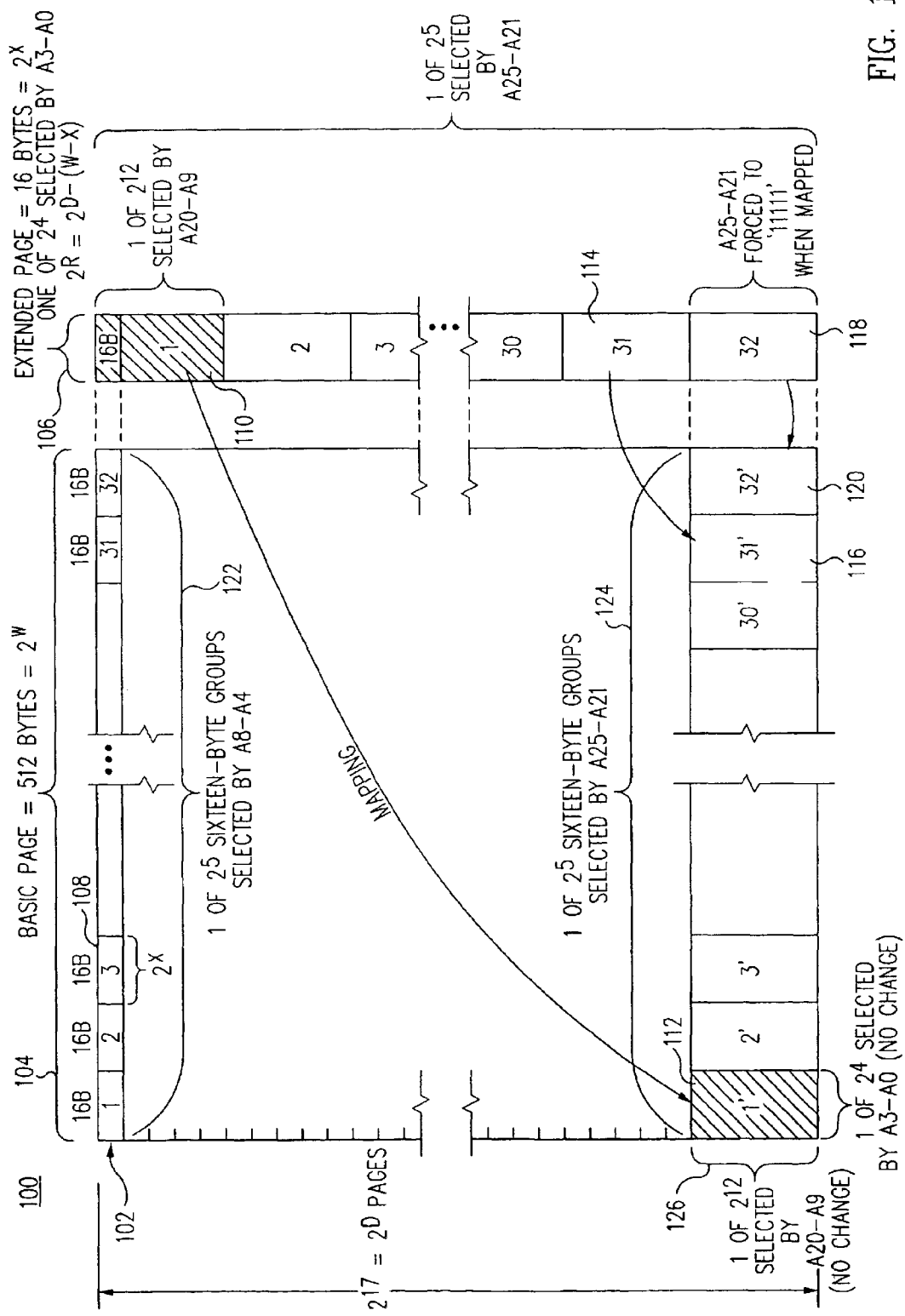
FIG. 1 is a block diagram of a memory organization illustrating a memory mapping in accordance with an embodiment of the present invention.

Referring now to FIG. 1, a block diagram of an exemplary memory organization 100 is depicted that is organized into a plurality of memory pages. As used herein, a memory organization is defined by a width, depth, and a data port of the memory. In the exemplary embodiment shown, specific details such as page sizes and addressing information are described to assist in the understanding of the invention, but it should be understood that such specific examples are merely illustrative of the embodiment and not limiting of the invention. The data port size is frequently an 8-bit byte, although any number of bits may be implemented. In the embodiment shown, each page includes 528 bytes, of which 512 (i.e., $2^9$) bytes may be termed a basic page and the remaining 16 (i.e., $2^4$) bytes termed an extended page. One such page is labeled 102 in the figure, and whose width (i.e., page size) is depicted running horizontally across the figure. In the exemplary embodiment shown, there are 131,072 (i.e., $2^{17}$) pages represented extending vertically down the figure. A given page may be selected by decoding seventeen addresses, such as A25-A9.

The organization shown in FIG. 1 does not necessarily represent a physical memory array architecture. For example, each of the 8-bits of a given byte within a page may be respectively stored in a respective one of eight separate memory sub-arrays corresponding to the byte. Alternatively, all eight bits of a given byte may be stored within a single sub-array, either adjacent or physically distributed throughout the sub-array. The present invention comprehends many distinct physical arrangements of a memory array and/or sub-arrays, and the organization depicted in FIG. 1 is intended to abstract a memory array irrespective of certain implementation details of the physical array architecture and configuration.

In prior art devices, the extended pages (labeled as 106) may be supported by actually implementing each such extended page to respond to the same page address as its corresponding basic page. In such a case the memory cells forming the extended pages would be wasted if the user did not make use of such extended pages. Alternatively, the extended pages may be made available and addressable by a user, even though not physically implemented as such, by mapping each extended page into a portion of a basic page. Consequently, the memory array may be implemented as pages of the basic page width, and still support the basic page size as well as an increased size including the extended page for those users desiring to use the extended pages.

In the example shown, each basic page is thirty-two times wider than its corresponding extended page (i.e., $2^9/2^4=2^5=32$). Consequently, the locations comprising the extended pages may be segmented by rows into thirty-two groups of pages, and each group mapped into a single group of high-order basic pages. For example, one of the thirty-two page groups (i.e., page 'blocks') may be selected by a group of five addresses A25-A21 (for both basic pages and extended pages). Each extended page block, such as block 110, includes 4096 extended pages (i.e., rows), one of which is selected by twelve least-significant row addresses A20-A9. Each byte within each extended page is selected by four low-order column addresses A3-A0.

The extended page block 110 may be mapped into high-order basic page block 112 by conveying the five highest-order row addresses to instead function as the highest order column addresses, and setting the five highest-order row addresses to a desired value, such as '11111' which corresponds to the end of the memory depth, as depicted in FIG. 1. The four lowest-order column addresses (A3-A0) and the twelve lowest-order row addresses (A20-A9) are maintained. The thirty-two re-mapped extended page blocks "stack nicely" across and fully occupy the highest order group of 4096 basic pages (labeled as 126). The thirty-first extended page block (labeled as 114) maps into its associated high-order basic page block 116, while the thirty-second extended page block (labeled as 118), which is the highest-order extended page block, maps into its associated highest-order basic page block 120.

Each 512-byte basic page maybe sub-divided into thirty-two (32) different portions of a page, each holding 16-bytes, which may be referred to as sub-pages. Referring again to page 102 shown in FIG. 1, the thirty-two different sub-pages are selected by the five most-significant column addresses A8-A4 (indicated by bracket 122), while within each sub-page (such as sub-page 108) the individual bytes are selected by the four lowest-order column addresses A3-A0. In the re-mapped extended pages 126, however, each of the thirty-two sub-pages corresponds to a different extended page group and each is selected by the five highest-order row addresses A25-A2 (indicated by bracket 124) because of the address translation performed, while within each sub-page the individual bytes are selected by the four lowest-order column addresses A3-A0, as before.

The exemplary organization may be generalized somewhat by abstracting the assumed sizes. The basic page size is preferably any integral power 'W' of two, for a total of $2^W$ locations within each basic page (in the example above, $2^9$). The additional size of an extended page is preferably an integral power 'X' of two, where X is smaller than W (in the example above, $2^3$), giving rise in an extended mode to a total page size of $2^W+2^X$ (in the example above, 528). The ratio of the basic page width to the extended page width is therefore $2^W/2^X=2^{(W-X)}$ (in the example above, $2^{(9-4)}=2^5=32$). The depth of the memory is preferably any power of two (i.e., D) that is larger than (W−X) (in the example above, $2^{17}$). The locations forming the extended pages are segmented into $2^{(W-X)}$ groups (in the example above, 32) each containing $2^R=2^{D-(W-X)}$ rows (in the example above, $2^R=2^{12}=4096$ rows). These extended page groups may be mapped into the high order basic pages by maintaining the 'X' least-significant (i.e., lowest-order) column address bits and the 'R' least-significant row address bits, while conveying the (W−X) most-significant row address bits for use instead as the (W−X) most significant column address bits, and setting the (W−X) most-significant row address bits to any portion of the memory depth desired for the re-mapped pages. One particularly useful choice, as illustrated in FIG. 1, re-maps the extended pages to the "top" of the memory depth (i.e., the highest-order pages) by setting the each of the (W−X) most-significant row address bits to a logic 1.

Figure 5:
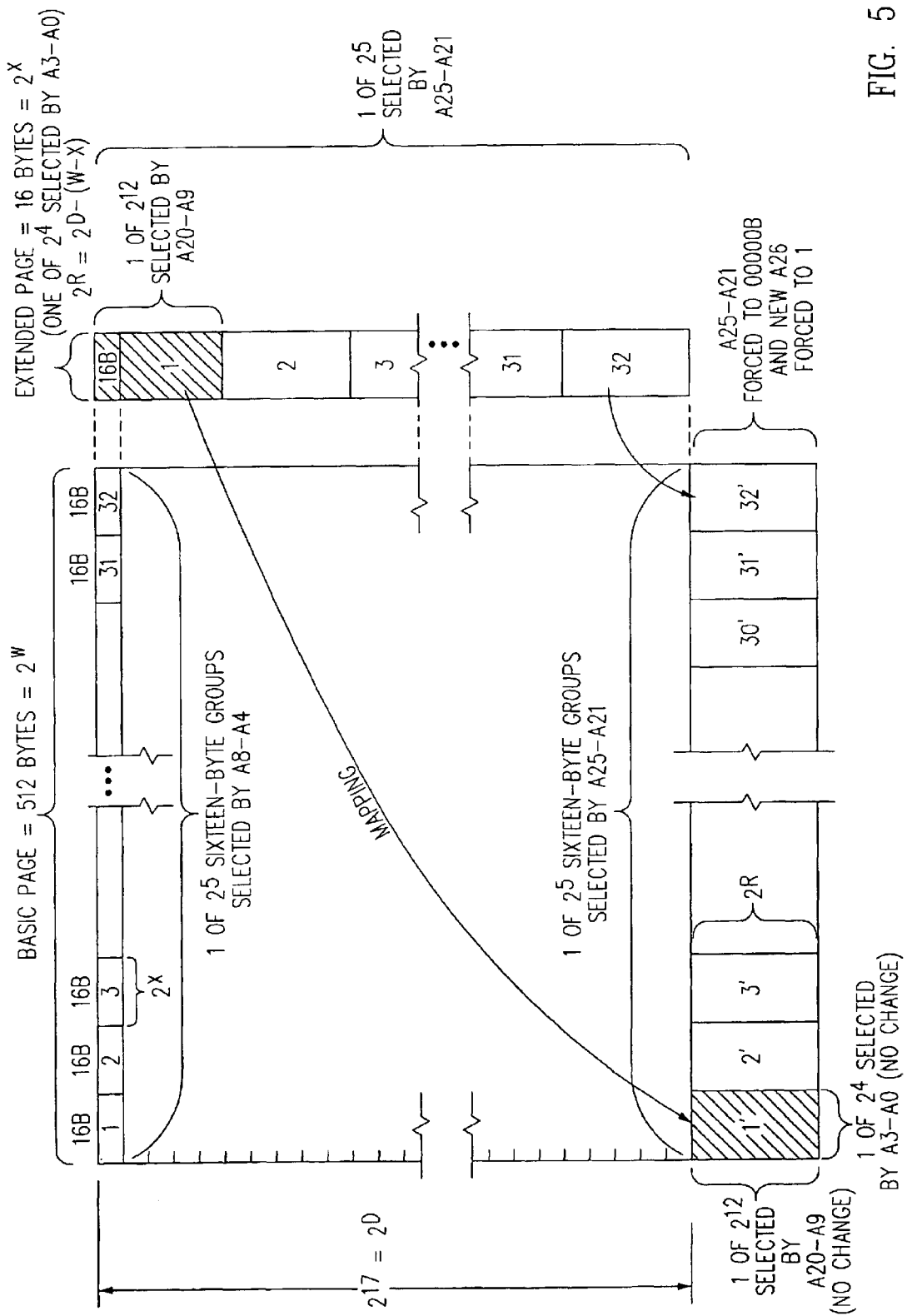
FIG. 5 is a block diagram of a memory organization illustrating a memory mapping in accordance with another embodiment of the present invention.

In another useful embodiment, the memory depth is extended beyond $2^D$ pages by adding an additional most-significant row address bit A26 which is set to a logic 1, and by setting the each of the (W−X) previously most-significant row address A25-A21 bits to a logic 0. This embodiment is illustrated in FIG. 5.

Such mappings are generally applicable if the basic page width is a power of two (e.g., $2^W$), if the extended page width is a power of two (e.g., $2^X$) and if R is less than or equal to D−(W−X). These are not significant restrictions, and provide many different mapping possibilities for various memory organizations. In such cases, the number of dual-addressable pages is equal to $2^{D-(W-X)}$. Preferably X has a value from 3 to 5, W has a preferred value from 6 to 12, and (W−X) has a preferred value from 3 to 7. Many other mappings are possible, even though some may be less convenient. Other particularly useful mappings are described herebelow.

Referring now to FIG. 2, an address translation circuit 150 is shown which achieves the dual organization shown in the embodiment of FIG. 1. The five most-significant row address bits are assumed to be A25-A21, while the five most-significant column address bits are assumed to be A8-A4. To access a location within a basic page, a BASIC PAGE ACCESS signal conveyed on node 152 is active (in this case, a logic high) which steers the 'effective' or 'apparent' column addresses A8-A4 through gates 154 and 156 to the 'physical' column addresses A8-A4 for the memory array, and similarly steers the effective row addresses A25-A21 through gates 158 and 160 to the physical row addresses A25-A21 for the memory array. However, to access a location within an extended page, an EXTENDED PAGE ACCESS signal conveyed on node 162 is active (and the BASIC PAGE ACCESS signal inactive) which steers the effective row addresses A25-A21 through gates 164 and 156 to the physical column addresses A8-A4 for the memory array, and sets each of the physical row addresses A25-A21 for the memory array to a logic 1. The effective column addresses A8-A4 in this case are ignored.

As can be discerned, the address translation circuit 150 may be implemented in an integrated circuit using an insignificantly small amount of additional circuitry that consumes an insignificantly small additional layout area. In a device compatible with flash devices such as the Toshiba TH58512FT, the A8 address information is provided by a command rather than by an explicit address, with A8=0 being implied by a '00H' command, and A8=1 being implied by a '01H' command. In addition, the BASIC PAGE ACCESS signal may be implied by the '00H' command and the '01H' command, while the EXTENDED PAGE ACCESS signal may be implied by the '50H' command.

The address translation circuit 150 shown in FIG. 2 is but one of many possible circuits to implement the mapping shown in FIG. 1. Another address translation circuit 170 is shown in FIG. 3. A combined signal conveyed on node 172 is high to indicate basic page access and low to indicate extended page access. A first multiplexer 174 steers either the effective row addresses A25-A21 or the effective column addresses A8-A4 to the physical column address A8-A4 for the memory array, and a second multiplexer 176 steers either the effective row addresses A25-A21 or all logic 1's to the physical row address A25-A21. Other address translation circuits may easily be implemented by one skilled in the art to take advantage of teachings of this disclosure. For example, other such translation circuits may invert all or some of the addresses (assuming that remaining decoding circuits correspond) and may choose different particular address translations to map the extended pages into basic pages. Such circuits are not complex, are not performance sensitive for many pipelined, block-oriented, or page-oriented memory organizations, and whose implementation is well within an ordinary level of skill in the art.

Figure 4:
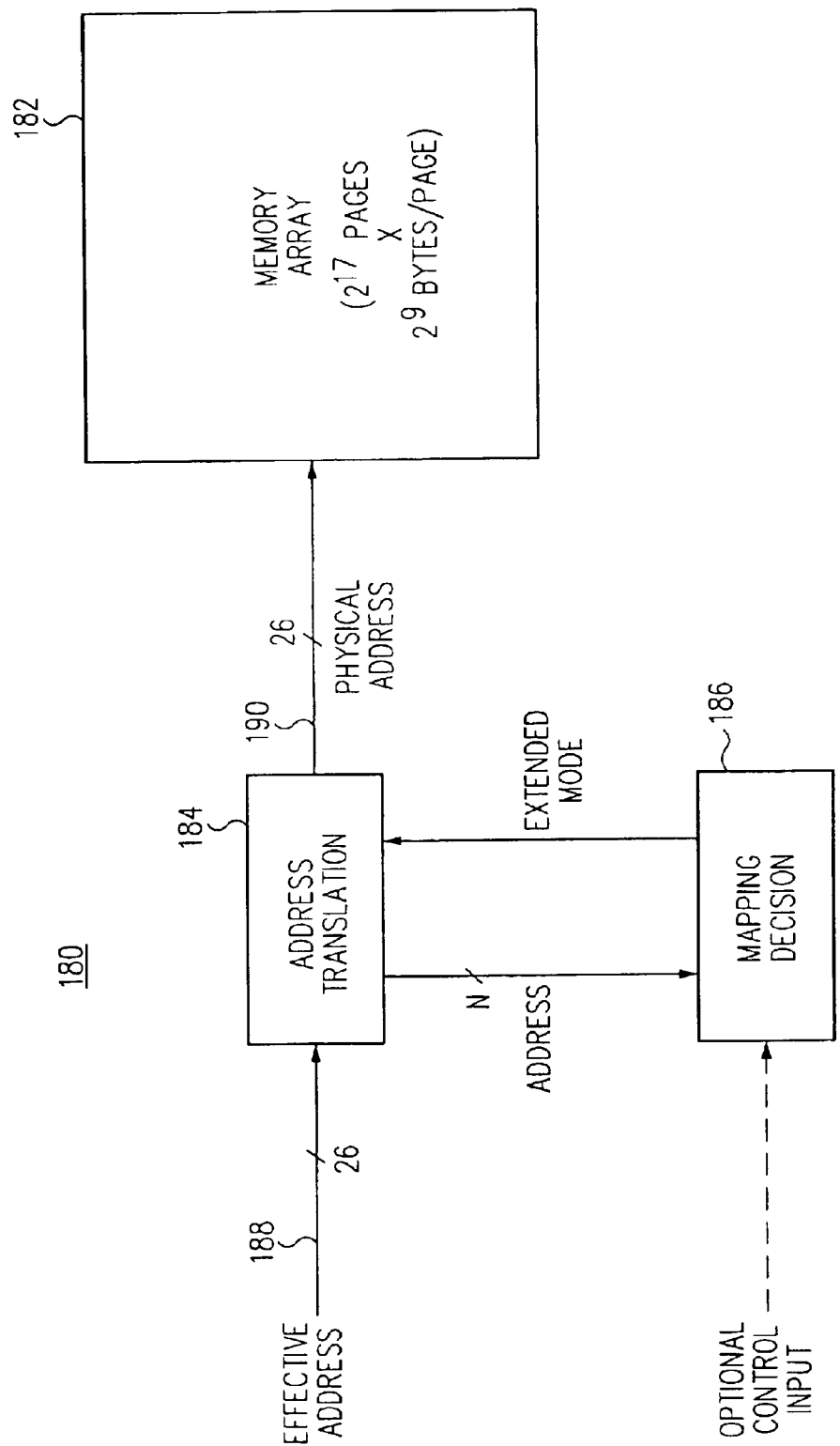
FIG. 4 is a block diagram of a memory array and related control circuits in accordance with an embodiment of the present invention.

Referring now to FIG. 4, portions of an exemplary integrated circuit 180 are depicted which provides dual organization of a memory array as described above to support two different page sizes. A memory array 182 is implemented as $2^{17}$ pages, each containing $2^9$ bytes per page. An address translation block receives a 26-bit effective address conveyed on bus 188 and conditionally translates the address to generate a physical address conveyed on bus 190. A mapping decision block 186 is provided to determine whether to provide support for extended pages by mapping the extended pages into corresponding basic pages. Such a determination may be based upon an optional control signal (such as a '50H' command), or upon one or more bits of the effective address, or both.

A memory device incorporating an embodiment of this invention which utilizes an architecture and command sequence similar to the Toshiba TH58512FT may advantageously be implemented to default to basic, page mode accesses of the memory array 182. The mapping decision block 186 is preferably configured to receive an indication when the '50H' command is first invoked to access an extended page, and the address translation block 184 is then set for extended page mode operation. The extended pages are mapped into, for example, the highest order basic pages which are preferably unavailable for normal use. If no '50H' command is received, and only '00H' and '01H' commands are received, the address translation block 184 passes both the effective row and column addresses to the array 182 unchanged. Consequently, a single device may be used to provide $(^{31}/_{32})*131,072$ pages when in the extended page mode (i.e., the extended pages being mapped into the last $^1/_{32}$ of the basic pages), and may also be used to provide the full 131,072 pages when extended page mode operation is not called for.

Figure 6:
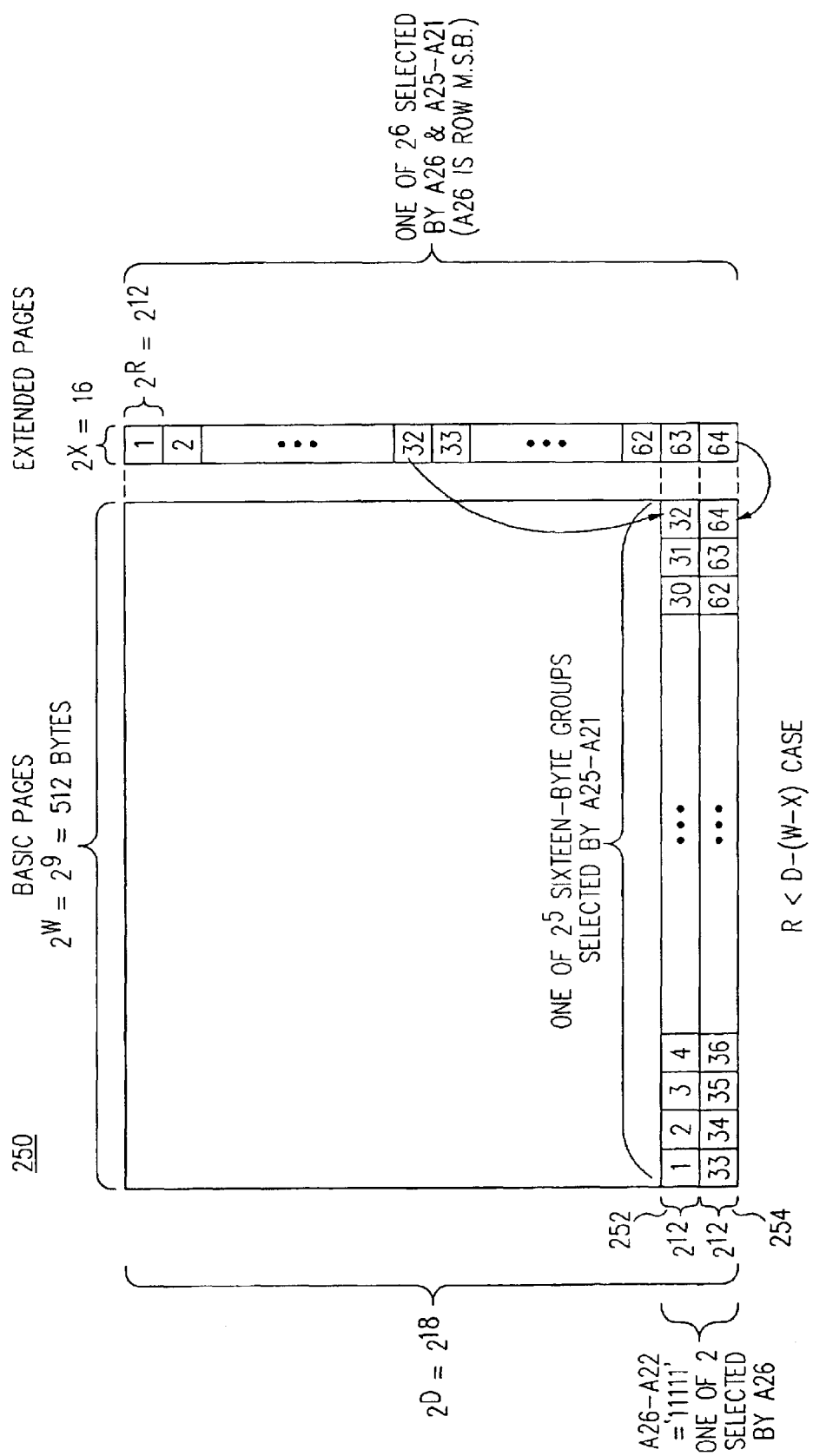
FIG. 6 is a block diagram of a memory organization illustrating a memory mapping in accordance with yet another embodiment of the present invention.

Another convenient page mapping 250 is illustrated in FIG. 6 for a case where R is less than D−(W−X). Assume W=9 for a basic page size of 512 bytes, and assume X=4 for an extended page size of 16, both as before. However, in this example, assume that D=18, for a memory depth of $2^{18}$ or 262,144. The ratio of the basic page width to the extended page width is still equal to $2^{(W-X)}=2^5=32$. Assume however, that the extended pages are segmented into $2^6=64$ groups, each containing $2^R=2^{(18-6)}=2^{12}=4096$ rows, as before. These 'row' groups may be mapped into the high order pages by maintaining the 'X' least-significant column address bits A3-A0 and the 'R' least-significant row address bits A20-A9, while conveying the effective row address bits A25-A21 for use instead as the physical column address bits A8-A4, conveying the effective row address A26 to the physical row address A21, and setting the physical row address bits A26-A22 to '11111'. The upper thirty-two extended pages are mapped into a first re-mapped page group 252, and the lower thirty-two extended pages are mapped into a second re-mapped page group 254 adjacent to the first group 252.

Figure 7:
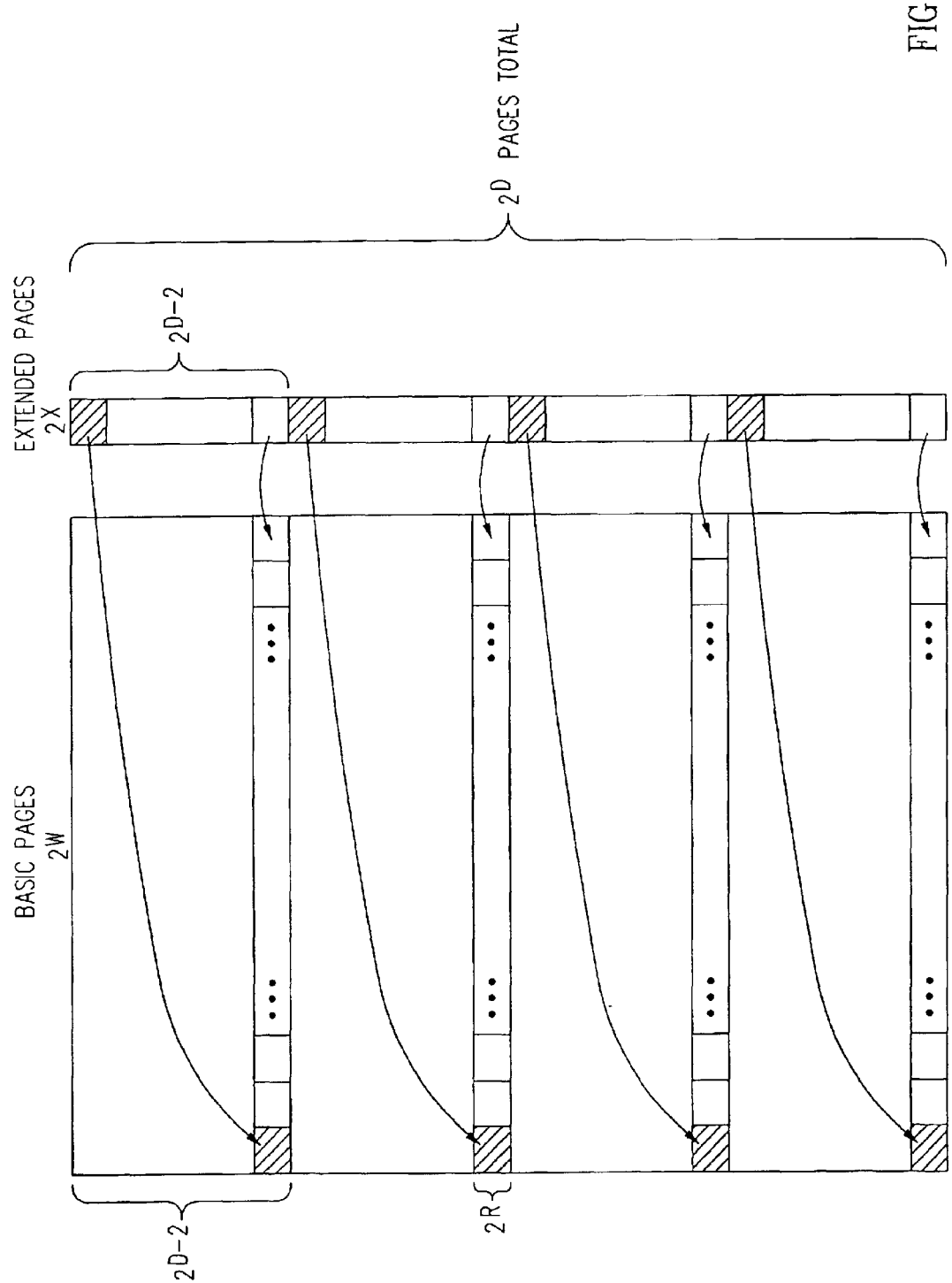
FIG. 7 is a block diagram of a memory organization illustrating a memory mapping in accordance with still another embodiment of the present invention.

Other mappings are specifically contemplated, including cases in which the re-mapped extended pages are not all contiguous in the basic page space. Referring now to FIG. 7, such a mapping is conceptually shown for a case where R=D−(W−X)−2. The ratio of the basic page width to the extended page width is equal to $2^{(W-X)}$. The extended pages are segmented into $2^{(D-R)}=2^{(W-X+2)}$ groups, each containing $2^R$ rows. These row groups may be mapped into a total of $2^2=4$ basic page groups, each having $2^R$ pages. In this embodiment, the two most-significant effective row address bits are conveyed unchanged to the two most-significant physical row address bits, and the (W−X) next most significant effective row address bits are conveyed to the (W−X) most significant physical column address bits. The corresponding (W−X) next most significant physical row address bits are set to a logic '1' (or to some other desired page address).

In any of these embodiments described thus far that map the 16-byte extended pages into 512-byte basic pages, a sequential read operation that extends from a basic page into an extended page requires crossing a page boundary between two basic pages. This may require an additional delay to access the second basic page into which the extended page is mapped, and may produce an additional 'busy signal' during the delay. But this operation is less commonly used because of the inconvenience of the 528-byte page size. However, in certain applications it may be desirable to sequentially read just the extended pages, which previously crosses a page boundary and generates a 'busy signal' every 16 bytes.

Figure 8:
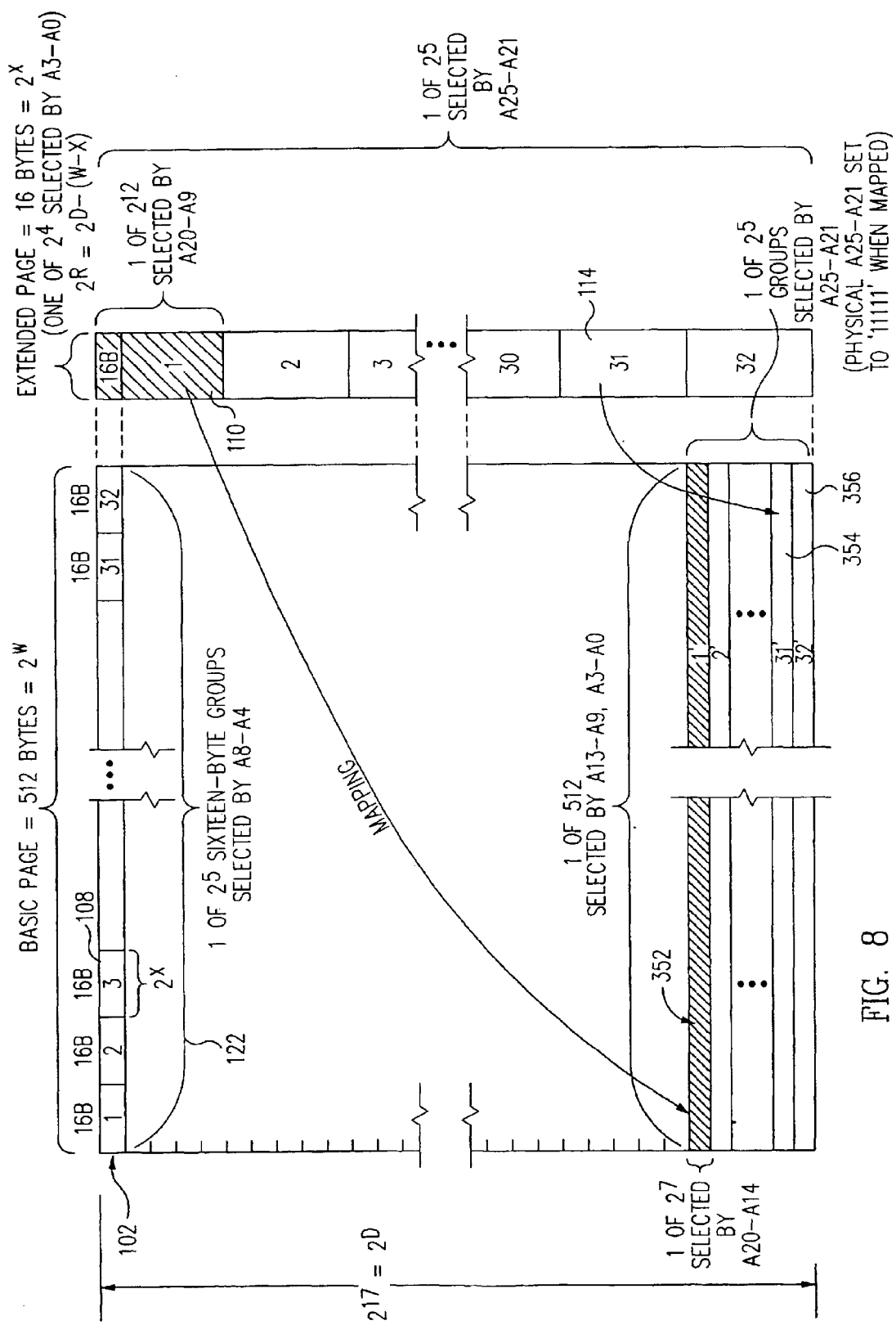
FIG. 8 is a block diagram of a memory organization illustrating a memory mapping in accordance with an additional embodiment of the present invention.

Referring now to FIG. 8, another mapping (of many possible mappings) is shown which provides a minimum of 'busy signals' between page accesses when sequentially reading through just the extended pages. In this example, the extended page block 10 is mapped into high-order basic page block 352 by mapping the five least-significant effective row addresses A13-A9 to instead function as the five most-significant physical column addresses A8-A4, mapping the seven effective row addresses A20-A14 to physical row addresses A15-A9, mapping the five most-significant effective row addresses A25-A21 to physical row addresses A20-A16, and setting the five highest-order physical row addresses to '11111'. The four lowest-order effective column addresses (A3-A0) are maintained as the physical column addresses A3-A0, and the effective column addresses A8-A4 are ignored.

To aid in understanding this mapping, each of the thirty-two different sub-pages in a non-mapped page are normally selected by the five most-significant column addresses A8-A4 (indicated by bracket 122), while within each sub-page (such as sub-page 108) the individual bytes are selected by the four lowest-order column addresses A3-A0. In the re-mapped extended page 352 however, each of the thirty-two sub-pages corresponds to a different row within the extended page group 110 and each is selected by the five lowest-order effective row addresses A13-A9, while within each sub-page the individual bytes are selected by the four lowest-order column addresses A3-A0, as before.

The thirty-first extended page block (labeled as 114) maps into its associated high-order basic page block 354, while the thirty-second extended page block (labeled as 118), which is the highest-order extended page block, maps into its associated highest-order basic page block 356. This mapping 'stretches out' the extended page block 110 into a basic page block that spans all the way across all 512 bytes of the basic page, and further maps a plurality of adjacent rows (i.e., pages) of the extended page block 110 as adjacent 16-byte sub-pages within the basic page block 352. As before, the thirty-two re-mapped extended page blocks fully occupy the highest order group of 4096 basic pages. In this embodiment, each of the thirty-two re-mapped blocks comprises 128 rows by 512 columns, rather than 4096 rows by 16 columns as in FIG. 1.

By using this mapping, a command sequence to sequentially read through just the extended pages now crosses a boundary 32 times less frequently (e.g., every 512 bytes) than before. This may generate far fewer busy signals and result in higher performance than achievable in the prior art memory arrangement. Such increased performance may be particularly beneficial in implementing solid-state file structures in memories such as flash or other non-volatile memory devices.

The embodiment shown in FIG. 8 maps the extended blocks into contiguous blocks in the basic page space. The benefits of reduced 'busy signals' may also be achieved even if the re-mapped blocks are physically distributed or discontiguous. For example, the extended block 110 may be mapped into 128 separate rows, being every 32 rows of the last 4096 rows. Such a mapping may be accomplished by mapping the effective row addresses A13-A9 to physical column addresses A8-A4 (as before), and mapping the effective row addresses A25-A21 to physical row addresses A13-A9 (and setting the five highest-order physical row addresses to '11111'). In this case only five column addresses and five row addresses need be mapped.

In the embodiments described above, all the locations within a particular extended page have been mapped into a single associated basic page. In other embodiments incorporating translations of other address bits, the locations of a particular extended page may be mapped into more than one associated basic page, although it is believed to be less desirable if sequential accesses of locations within the extended pages are anticipated. Other mappings are specifically contemplated, although those shown are illustrative of several of the believed more useful mappings.

In a non-volatile embodiment of the present invention which utilizes internal error correction to achieve 100% effective post-programming yield, the 2–3% of the spare pages otherwise reserved for redundancy may be made available for use, either as more pages of the basic page size, or as the re-mapped extended pages. For example, in an exemplary embodiment of an integrated circuit including a three-dimensional write-once memory array, the array is divided into 72 sub-arrays. Eight error correction check/ syndrome bits are concatenated to each 64 bit data word to generate a 72-bit ECC data word. Preferably each bit of this 72-bit ECC data word is written physically into a different corresponding one of the 72 sub-arrays. Additional details of such exemplary embodiments are described in U.S. patent application Ser. No. 09/747,574 entitled "Three-Dimensional Memory Array and Method for Storing Data Bits and ECC Bits Therein," filed on Dec. 22, 2000, by Thomas H. Lee, et al., which application is hereby incorporated by reference, and described in U.S. patent application Ser. No. 09/748,649, entitled "Partial Selection of Passive Element Memory Cell Sub-Arrays for Write Operation," filed on Dec. 22, 2000, by Roy E. Scheuerlein, et al., which application is hereby incorporated by reference. In other embodiments, a memory array may advantageously be implemented with two bits stored within each of 32 sub-arrays.

In an embodiment of the invention as shown in FIG. 4, the memory array 182 is preferably a three-dimensional, non-volatile, field-programmable write-once memory array of passive element memory cells, although other memory arrays are also suitable and specifically contemplated, such as three-terminal memory cell arrays. Each passive element memory cell within the memory array 182 is generally a two-terminal memory cell having a steering element in series with a state change element, together connected between usually orthogonal (but not necessarily so) array terminal lines. These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

An advantageous passive element memory cell is a structure combining an antifuse and a diode in series as the memory cell. Such memory cells are preferably implemented within a three-dimensional memory array which has at least two levels of memory cells. Suitable memory cells are described in U.S. application Ser. No. 09/897,705 entitled "Three-Dimensional Memory Array Incorporating Serial Chain Diode Stack" filed on Jun. 29, 2001, U.S. application Ser. No. 09/814,727 entitled "Three-Dimensional Memory Array and Method of Fabrication" filed on Mar. 21, 2001, U.S. application Ser. No. 09/560,626 entitled "Three-Dimensional Memory Array and Method of Fabrication" filed on Apr. 28, 2000, and in U.S. Pat. No. 6,034,882 entitled "Vertically Stacked Field Programmable Nonvolatile Memory and Method of Fabrication," each of which is hereby incorporated by reference.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 to Knall, and U.S. patent application Ser. No. 09/638,428 to Johnson, et al., each of which is hereby incorporated by reference. Specifically an antifuse memory cell is preferred. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

Integrated circuits incorporating a memory array usually subdivide the array into a sometimes large number of sub-arrays. As frequently used, a sub-array is a contiguous group of memory cells having contiguous word and bit lines generally unbroken by decoders, drivers, sense amplifiers, and input/output circuits. A large memory array is frequently subdivided into smaller sub-arrays to decrease the number of memory cells which are simultaneously accessed and/or to improve performance. Nonetheless, for ease of description, an array may also be used synonymously with sub-array to refer to a contiguous group of memory cells having contiguous array terminal lines generally unbroken by decoders, drivers, sense amplifiers, and input/output circuits. As used herein, an integrated circuit may include one or more than one memory array.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are frequently, but not always, connected to the anode terminal of the memory cells, and Y-lines (or bit lines) are frequently, but not always, connected to the cathode terminal of the memory cells. Secondly, the memory organization (e.g., data bus width, number of bits simultaneously read during an operation, etc.) may have some association with viewing one set of the two array lines more aligned with data "bits" rather than data "words." Such various array organizations and configurations are well known in the art, and the invention is intended to comprehend a wide variety of such variations. It should be understood that a memory that is organized as pages may be described as having 'rows' which correspond to pages and 'columns' which correspond to locations or offsets within a page. Such rows and columns frequently transcend and should not be confused with the physical rows and columns found in individual sub-arrays used in the physical implementation of the memory.

Nonetheless, the techniques described above in the context of a memory organized as pages may be applied to memory organizations having a number of columns that is a non-traditional binary boundary (i.e., not equal to an integral power of two). The additional columns of each row beyond a traditional binary boundary may be mapped into other rows in an analogous fashion as described above. Similarly, in memory organizations having a number of rows that is not equal to an integral power of two, the additional rows of each column beyond a traditional binary boundary may be mapped into other columns. As a specific example, the physical length of a word line (e.g., a row in a single level memory array) may be implemented to be either larger or smaller than the page size. The physical length of a word line is a trade-off between the resistance of long lines and the leakage current of a contiguous array of passive element memory cells (which increases as the number of cells on a row line increases) versus the relative area for support circuitry (which generally decreases as the number of cells on a row line increases). In a preferred embodiment a single physical word line includes or spans two basic pages.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

The descriptions of the various embodiments provided herein are believed to provide ample insight and details of the present invention to enable one of ordinary skill in the art to practice the invention. Although certain supporting circuits (e.g., decoders, drivers, switches, multiplexers, control circuits, input./output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation.

It will be appreciated by one skilled in the art that any of several expressions may be equally well used when describing the operation of a circuit including the various signals and nodes within the circuit, and no subtle inferences should be read into varied usage within this description. A logic signal has an active level (i.e., active state) and an inactive level (at least for traditional binary logic signals). The active level for some logic signals is a high level (i.e., an "active-high" signal) and for others is a low level (i.e., an "active-low" signal). A logic signal is "asserted" or "activated" when driven to its active level. Conversely, a logic signal is "de-asserted" or "de-activated" when driven to its inactive level. A high logic level is frequently referred to as a logic "1" and a low logic level is frequently referred to as a logic "0" (at least for positive logic). Frequently logic signals are named in a fashion to convey which level is the active level. The schematic diagrams and accompanying description of the signals and nodes should in context be clear.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. In particular, even though the preferred embodiments are described in the context of a passive element memory array, the teachings of the present invention are believed advantageous for use with other types of memory cells, such as certain 3-terminal memory cells, such as flash EPROM cells. While certain embodiments have been described in the context of a three-dimensional, field-programmable, write once memory array, it should be appreciated that such an array is not necessarily required. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit comprising:

a memory array organized in pages of a first width, which memory array is addressable as pages of the first width and addressable as pages of a second width that is an additional width greater than the first width;

wherein, when addressable as pages of the second width, the additional width of each page of the second width is mapped into at least one associated page of the first width.

2. The integrated circuit defined in claim 1 wherein:

when addressed as pages of the second width, each respective page is addressable as a respective basic page of the first width and as a respective extended page of a width smaller than the first width.

3. The integrated circuit defined in claim 2 wherein:

when addressed as pages of the second width, the memory array is configured to map each extended page into a corresponding portion of a corresponding basic page.

4. The integrated circuit defined in claim 1 wherein:

the memory array, when first addressed as pages of the second width, is configured to map the additional width of each respective page of the second width into a respective associated page of the first width.

5. The integrated circuit defined in claim 4 wherein the memory array is accessed byte-serially by page.

6. The integrated circuit defined in claim 1 wherein:

the memory array comprises a non-volatile memory array.

7. The integrated circuit defined in claim 6 wherein:

the memory array comprises a three-dimensional memory array.

8. The integrated circuit defined in claim 6 wherein:

the non-volatile memory array comprises passive element memory cells.

9. The integrated circuit defined in claim 1 wherein the memory array comprises a three-dimensional memory array having more than one plane of memory cells.

10. An integrated circuit comprising:

a memory array organized as a plurality of pages having a page width;

an address translation block for translating an address of an effective location within a page that falls beyond the page width, into a corresponding address of a corresponding location of a corresponding page that falls within the page width, thereby mapping an effective page location beyond its page width into an associated page.

11. The integrated circuit defined in claim 10 wherein:
the address translation block is arranged to map at least one address bit that specifies a page into an address bit specifying a location within an associated page.

12. The integrated circuit defined in claim 10 wherein:
the address translation block is arranged to map effective locations within the pages beyond the page width into a contiguous group of pages located at one end of the memory array.

13. The integrated circuit defined in claim 10 wherein:
the page width is equal to a first integral power of two; and
the number of mapped locations of each page is equal to a second integral power of two.

14. The integrated circuit defined in claim 13 wherein:
the first integral power of two is not equal to the second integral power of two.

15. The integrated circuit defined in claim 14 wherein the memory array is accessed byte-serially by page.

16. The integrated circuit defined in claim 10 wherein:
the memory array comprises a non-volatile memory array.

17. The integrated circuit defined in claim 10 wherein:
the memory array comprises a plurality of sub-arrays.

18. The integrated circuit defined in claim 10 wherein:
the memory array comprises at least one sub-array, each of which includes a plurality of memory cells, each coupled to a respective one of a plurality of first array terminal lines and coupled to a respective one of a plurality of second array terminal lines; and
the first page width is smaller than the number of memory cells respectively coupled to each of the plurality of first array terminal lines.

19. The integrated circuit defined in claim 10 wherein:
the memory array comprises at least one sub-array, each of which includes a plurality of memory cells, each coupled to a respective one of a plurality of first array terminal lines and coupled to a respective one of a plurality of second array terminal lines; and
the first page width is greater than or equal to the number of memory cells respectively coupled to each of the plurality of first array terminal lines.

20. The integrated circuit defined in claim 10 wherein the memory array comprises a three-dimensional memory array having more than one plane of memory cells.

21. An integrated circuit comprising:
a memory array organized as a plurality of at least $2^D$ pages, each of width $2^W$; and
an address translation block for translating an address that references an effective location within a page that is greater than its page width $2^W$ by up to an additional width $2^X$, into a corresponding address that references a corresponding location within a corresponding page of width $2^W$;
wherein D, W, and X are non-negative integers, W is greater than X, and D is greater than (W−X).

22. The integrated circuit defined in claim 21 wherein:
the memory array is addressable as at least $2^D - 2^{D-(W-X)}$ pages of width $2^W + 2^X$, each such page comprising a basic page of width $2^W$ and an extended page of width $2^X$; and
the address translation block is configured to map the $2^D$ extended pages of width $2^X$ into a group of $2^{D-(W-X)}$ basic pages of width $2^W$.

23. The integrated circuit defined in claim 22 wherein:
the group of $2^{D-(W-X)}$ basic pages into which the extended pages are mapped are contiguous pages located at one end of the memory array.

24. The integrated circuit defined in claim 23 wherein:
the respective extended pages of a plurality of adjacent pages are mapped into a single basic page.

25. The integrated circuit defined in claim 23 wherein:
the memory array comprises a non-volatile memory array.

26. The integrated circuit defined in claim 25 wherein the memory array comprises a three-dimensional memory array having more than one plane of memory cells.

27. The integrated circuit defined in claim 22 wherein:
the group of $2^{D-(W-X)}$ basic pages into which the extended pages are mapped are non-contiguous pages comprising at least two groups of at least one page per group within the memory array.

28. The integrated circuit defined in claim 22 wherein:
X is within the range 3 to 5; and
W is within the range 6 to 12.

29. The integrated circuit defined in claim 22 wherein:
when an extended page is first addressed, the $2^D$ extended pages of width $2^X$ are mapped into a group of $2^{D-(W-X)}$ basic pages of width $2^W$; and
otherwise, said group of $2^{D-(W-X)}$ basic pages of width $2^W$ are addressable in like fashion as other basic pages, thereby providing at least $2^D$ addressable basic pages of width $2^W$.

30. The integrated circuit defined in claim 29 wherein the memory array is accessed byte-serially by page.

31. The integrated circuit defined in claim 21 wherein:
the memory array comprises a non-volatile memory array of passive element memory cells.

32. The integrated circuit defined in claim 21 wherein:
the memory array comprises a plurality of sub-arrays.

33. The integrated circuit defined in claim 21 wherein:
each page location comprises a plurality of memory cells.

34. The integrated circuit defined in claim 33 wherein:
the plurality of memory cells comprising each page location are distributed among at least two sub-arrays.

35. The integrated circuit defined in claim 33 wherein:
the plurality of memory cells comprising each page location are disposed in a single sub-array.

36. The integrated circuit defined in claim 21 wherein the memory array comprises a three-dimensional memory array having more than one plane of memory cells.

37. The integrated circuit defined in claim 21 wherein the memory array is accessed byte-serially by page.

38. An integrated circuit comprising:
a memory array having at least $2^M$ rows and having $2^N$ columns of memory locations, but which is addressable as rows having more than $2^N$ columns;
wherein a location having a column address greater than $2^N$ is mapped into an associated location of an associated row, having a column address no larger than $2^N$; and
wherein M and N positive integers.

39. The integrated circuit defined in claim 38 further comprising:
an address translation block for translating an address having a row address portion up to $2^M$ and having a column address portion greater than $2^N$ by up to an additional $2^X$, into a corresponding address having a corresponding row address portion and having a corresponding column address portion no greater than $2^N$.

40. The integrated circuit defined in claim 39 wherein:
the memory array is addressable as at least $2^M - 2^{M-(N-X)}$ rows, each having $2^N + 2^X$ columns; and
the address translation block is configured to map the upper $2^X$ addressable columns of each of the $2^M$ rows into a group of $2^{M-(N-X)}$ rows each having $2^N$ columns.

41. The integrated circuit defined in claim 40 wherein:
the group of $2^{M-(N-X)}$ rows into which the upper $2^X$ addressable columns are mapped are contiguous rows located at one end of the memory array.

42. The integrated circuit defined in claim 40 wherein:
the group of $2^{M-(N-X)}$ rows into which the upper $2^X$ addressable columns are mapped are non-contiguous rows comprising at least two groups of at least one row per group within the memory array.

43. The integrated circuit defined in claim 40 wherein:
X is within the range 3 to 5; and
N is within the range 6 to 12.

44. The integrated circuit defined in claim 38 wherein:
the memory array comprises a non-volatile memory array.

45. The integrated circuit defined in claim 38 wherein:
the memory array comprises a plurality of sub-arrays.

46. The integrated circuit defined in claim 38 wherein:
each memory location comprises a plurality of memory cells distributed among at least two memory sub-arrays.

47. An integrated circuit comprising:
a memory array addressable as a plurality P1 of pages of a width S1 defining a corresponding number of bits N1, and also addressable as a plurality P2 of pages of a width S2 defining a corresponding number of bits N2;
wherein P1 is not equal to P2, S1 is not equal to one-half of S2, and S1 is not equal to S2.

48. The integrated circuit defined in claim 47 wherein:
N1 substantially equals N2.

49. The integrated circuit defined in claim 47 wherein:
S1 is an integral power of two;
S2 is not an integral power of two; and
S2 is larger than S1.

50. The integrated circuit defined in claim 49 wherein:
(S2-S1) is an integral power of two.

51. The integrated circuit defined in claim 49 wherein:
S1 is equal to 512 bytes; and
S2 is equal to 528 bytes.

52. The integrated circuit defined in claim 49 wherein:
the memory is configured to be addressable only as page width S2 when such larger page width is first addressed.

53. The integrated circuit defined in claim 49 wherein the memory array comprises a three-dimensional memory array having more than one plane of memory cells.

54. The integrated circuit defined in claim 47 wherein:
the memory comprises a plurality of non-volatile memory sub-arrays; and
the memory is configured to store more than one bit at each page location.

55. The integrated circuit defined in claim 47 wherein the memory array comprises a three-dimensional memory array having more than one plane of memory cells.

56. An integrated circuit comprising:
a memory array of memory cells organized in pages, which memory array is addressable in a first mode as pages of a first width and addressable in a second mode as pages of a second width greater than the first width;
wherein the array is initially addressable in the first mode until a page larger than said first width is first addressed, and is then addressable only in the second mode; and
wherein substantially every memory cell that is addressable in one of the first and second modes is also addressable in the other mode.

57. The integrated circuit defined in claim 56 wherein:
at least one of the first width and second width is not an integral power of two.

58. The integrated circuit defined in claim 56 wherein the memory array comprises a three-dimensional memory array having more than one plane of memory cells.

59. The integrated circuit defined in claim 56 wherein the memory array is accessed byte-serially by page.

60. An integrated circuit comprising:
a three-dimensional memory array having more than one plane of memory cells, said memory array having at least a number R of rows and having at least a number C of columns of memory locations, having at least some dually-addressable memory locations, each said dually-addressable memory location being addressable at a respective first row address and respective first column address, and also addressable at a respective second row address and respective second column address;
wherein the respective first row address is different than the respective second row address, and the respective first column address is different than the respective second column address, for at least one dually-addressable memory location.

61. The integrated circuit defined in claim 60 wherein:
each dually-addressable memory location, once any of such locations is addressed at its respective second row address and respective second column address, is configured to only be addressable at its respective second row address and respective second column address.

62. The integrated circuit defined in claim 61 wherein:
the memory array comprises non-volatile passive element memory cells.

63. The integrated circuit defined in claim 61 wherein the memory array is accessed byte-serially by page.

64. An integrated circuit comprising:
a three dimensional memory array having more than one plane of memory cells, said memory array addressable as a plurality P1 of pages of a width S1 defining a corresponding number of bits N1, and also addressable as a plurality P2 of pages of a width S2 defining a corresponding number of bits N2;
wherein P1 is not equal to P2, and S1 is not equal to S2.

65. The integrated circuit defined in claim 64 wherein:
S1 is an integral power of two;
S2 is not an integral power of two; and
S2 is larger than S1.

66. The integrated circuit defined in claim 65 wherein:
(S2-S1) is an integral power of two.

67. The integrated circuit defined in claim 65 wherein:
the memory array is configured to be addressable only as page width S2 when such larger page width is first addressed.

68. The integrated circuit defined in claim 67 wherein the memory array is accessed byte-serially by page.

69. The integrated circuit defined in claim 64 wherein:
the memory array comprises a plurality of non-volatile memory sub-arrays; and
the memory array is configured to store more than one bit at each page location.

70. An integrated circuit comprising:

a memory array addressable as a plurality P1 of pages of a width S1 defining a corresponding number of bits N1, and also addressable as a plurality P2 of pages of a width S2 defining a corresponding number of bits N2;

wherein P1 is not equal to P2, and S1 is not equal to S2; and wherein the memory array comprises a plurality of non-volatile memory sub-arrays; and wherein the memory array is configured to store more than one bit at each page location.

71. The integrated circuit defined in claim 70 wherein:

S1 is an integral power of two;

S2 is not an integral power of two; and

S2 is larger than S1.

72. The integrated circuit defined in claim 71 wherein:

(S2-S1) is an integral power of two.

73. The integrated circuit defined in claim 71 wherein:

the memory array is configured to be addressable only as page width S2 when such larger page width is first addressed.

74. The integrated circuit defined in claim 73 wherein the memory array is accessed byte-serially by page.

* * * * *

UNITED STATES PATENT AND TRADEMARK OFFICE
CERTIFICATE OF CORRECTION

PATENT NO.    : 6,889,307 B1
DATED         : May 3, 2005
INVENTOR(S)   : Scheuerlein It is certified that error appears in the above-identified patent and that said Letters Patent is hereby corrected as shown below:

Column 1,
Line 37, the words "the page An" should read -- the page. An --.

Column 4,
Line 56, the word "maybe" should read -- may be --.
Line 67, the words "addresses A25-A2" should read -- addresses A25-A21 --.

Column 5,
Line 43, the words "$2^{D - (W - X))}$" should read -- $2^{(D - (W - X))}$ --.

Column 6,
Line 51, the words "basic, page" should read -- basic page --.

Column 7,
Line 54, the words "block 10" should read -- block 110 --.

Column 11,
Line 38, the words "input./output" should read -- input/output --.

Signed and Sealed this

Nineteenth Day of July, 2005

JON W. DUDAS
*Director of the United States Patent and Trademark Office*